United States Patent
Stamper et al.

(10) Patent No.: US 10,923,427 B2
(45) Date of Patent: Feb. 16, 2021

(54) SOI WAFERS WITH BURIED DIELECTRIC LAYERS TO PREVENT CU DIFFUSION

(71) Applicant: GLOBALFOUNDRIES U.S. Inc., Santa Clara, CA (US)

(72) Inventors: Anthony K. Stamper, Burlington, VT (US); Mukta G. Farooq, Hopewell Junction, NY (US); John A. Fitzsimmons, Poughkeepsie, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 21 days.

(21) Appl. No.: 16/266,196

(22) Filed: Feb. 4, 2019

(65) Prior Publication Data
US 2019/0172789 A1 Jun. 6, 2019

Related U.S. Application Data

(62) Division of application No. 15/713,756, filed on Sep. 25, 2017, now Pat. No. 10,242,947, which is a (Continued)

(51) Int. Cl.
*H01L 23/48* (2006.01)
*H01L 23/532* (2006.01)
(Continued)

(52) U.S. Cl.
CPC .. *H01L 23/53238* (2013.01); *H01L 21/76251* (2013.01); *H01L 21/76254* (2013.01);
(Continued)

(58) Field of Classification Search
None
See application file for complete search history.

(56) References Cited

U.S. PATENT DOCUMENTS

| 4,735,679 A | 4/1988 | Lasky |
| 4,771,016 A | 9/1988 | Bajor et al. |

(Continued)

FOREIGN PATENT DOCUMENTS

| CN | 1531066 A | 9/2004 |
| CN | 101663733 A | 3/2010 |

(Continued)

OTHER PUBLICATIONS

CN Search Report and English Translation thereof for corresponding CN Patent Application No. 201611241416.8 dated Nov. 20, 2019, 4 pages.
(Continued)

*Primary Examiner* — Michael Lebentritt
(74) *Attorney, Agent, or Firm* — David Cain; Hoffman Warnick LLC

(57) ABSTRACT

An SOI semiconductor device includes a first wafer having an active semiconductor layer and a first oxide layer and a second wafer having a semiconductor substrate and a second oxide layer, the first oxide layer being bonded to the second oxide layer, and one of the first wafer and the second wafer includes a nitride layer. The nitride layer can be formed between the semiconductor substrate and the second oxide layer. A third oxide layer can be formed on the semiconductor substrate and the nitride layer is formed between the second oxide layer and the third oxide layer. The nitride layer can be formed between the active semiconductor layer and the first oxide layer. The first wafer can include a third oxide layer formed on the active semiconductor layer and the nitride layer is formed between the third oxide layer and the first oxide layer.

14 Claims, 5 Drawing Sheets

Related U.S. Application Data division of application No. 14/982,097, filed on Dec. 29, 2015, now Pat. No. 9,806,025.

(51) Int. Cl.
  *H01L 21/762* (2006.01)
  *H01L 23/00* (2006.01)
  *H01L 21/768* (2006.01)
  *H01L 23/522* (2006.01)

(52) U.S. Cl.
  CPC .. *H01L 21/76852* (2013.01); *H01L 21/76898* (2013.01); *H01L 23/481* (2013.01); *H01L 24/05* (2013.01); *H01L 23/522* (2013.01); *H01L 2224/0401* (2013.01); *H01L 2224/05009* (2013.01); *H01L 2224/05147* (2013.01)

(56) References Cited

U.S. PATENT DOCUMENTS

| | | | |
|---|---|---|---|
| 5,272,104 | A | 12/1993 | Schrantz et al. |
| 5,276,338 | A | 1/1994 | Beyer et al. |
| 5,382,541 | A | 1/1995 | Bajor et al. |
| 5,387,555 | A | 2/1995 | Linn et al. |
| 6,255,731 | B1 | 7/2001 | Ohmi et al. |
| 6,455,398 | B1 | 9/2002 | Fonstad, Jr. et al. |
| 6,750,097 | B2 | 6/2004 | Divakaruni et al. |
| 6,841,848 | B2 | 1/2005 | MacNamara et al. |
| 6,861,320 | B1 | 3/2005 | Usenko |
| 6,864,155 | B2 | 3/2005 | Wang |
| 6,867,459 | B2 | 3/2005 | Burden |
| 6,949,451 | B2 | 9/2005 | Yeo et al. |
| 7,037,806 | B1 | 5/2006 | Atanackovic |
| 7,119,400 | B2 | 10/2006 | Burden |
| 7,462,552 | B2 | 12/2008 | Tong et al. |
| 7,807,482 | B2 | 10/2010 | Aspar et al. |
| 7,883,990 | B2 | 2/2011 | Levy et al. |
| 7,896,116 | B2 | 3/2011 | Tatematsu et al. |
| 8,039,361 | B2 | 10/2011 | Murphy et al. |
| 8,089,126 | B2 | 1/2012 | Botula et al. |
| 8,330,245 | B2 | 12/2012 | Pitney et al. |
| 8,357,974 | B2 | 1/2013 | Mohamed et al. |
| 8,395,213 | B2 | 3/2013 | Clifton et al. |
| 8,476,150 | B2 | 6/2013 | Jerome et al. |
| 8,557,679 | B2 | 10/2013 | Chuang et al. |
| 8,756,710 | B2 | 6/2014 | Wang et al. |
| 8,815,641 | B2 | 8/2014 | Jerome et al. |
| 8,846,493 | B2 | 9/2014 | Libbert et al. |
| 8,853,054 | B2 | 10/2014 | Zhang et al. |
| 9,070,729 | B2 | 6/2015 | Ji et al. |
| 9,806,025 | B2 * | 10/2017 | Stamper ............ H01L 23/53238 |
| 10,242,947 | B2 * | 3/2019 | Stamper ............ H01L 23/53238 |
| 2002/0070454 | A1 | 6/2002 | Yasukawa |
| 2003/0232466 | A1 | 12/2003 | Zistl |
| 2008/0261379 | A1 | 10/2008 | Jinbo et al. |
| 2011/0186840 | A1 | 8/2011 | Jerome |
| 2013/0087926 | A1 | 4/2013 | Pelley et al. |
| 2015/0028494 | A1 | 1/2015 | Park et al. |
| 2015/0249200 | A1 | 9/2015 | Harame et al. |

FOREIGN PATENT DOCUMENTS

| | | |
|---|---|---|
| CN | 103890939 A | 6/2014 |
| TW | 200503116 A | 1/2005 |
| TW | 200903658 A | 1/2009 |
| TW | 200903712 A | 1/2009 |
| TW | 2010320298 A | 5/2013 |

OTHER PUBLICATIONS

Johnson, "Hydrogen Ion-Implantation in Smart-Cut SOI Frabrication Techniqie", 6.774 Term Project, created Dec. 7, 2009, pp. 1-31 (http://web.mit.edu/joyj/www/Projects_files/6.774%20Final%20Report.pdf).

Examination Report issued in corresponding Taiwanese Patent Appln. No. 105138373 dated Sep. 30, 2017, 16 pages.

* cited by examiner

SOI WAFERS WITH BURIED DIELECTRIC LAYERS TO PREVENT CU DIFFUSION

CROSS-REFERENCE TO RELATED APPLICATIONS

This application is a divisional application of U.S. patent application Ser. No. 14/982,097, filed Dec. 29, 2015, now U.S. Pat. No. 9,806,025, and a divisional application of U.S. patent application Ser. No. 15/713,756, filed Sep. 25, 2017, currently allowed, the contents of each of which is herein incorporated by reference in its entirety.

BACKGROUND

This disclosure relates generally to buried SOI wafers and particularly to buried SOI wafers with a diffusion barrier in the buried SOI layer.

Through silicon via (TSV) semiconductor devices contain copper and use mobile ion, such as sodium or potassium, containing processes such as chemical mechanical polish (CMP). Copper or mobile ions can diffuse through silicon or oxide during packaging or chip use and reach devices such as FET's or MOS capacitors, resulting in threshold voltage shifts and other device degradation. Silicon on insulator wafers, which use a buried oxide (BOX), are used to form integrated circuits and the BOX can provide an unintended diffusion path for mobile ions or copper. The current trend is to use thinner silicon wafers with greater bow and higher aspect ratio TSV's (shorter and narrower TSV's), further increasing contamination concerns.

SUMMARY

In one embodiment an SOI semiconductor device comprises a first wafer having an active semiconductor layer and a first oxide layer; and a second wafer having a handle substrate and a second oxide layer, the first oxide layer of the first wafer being bonded to the second oxide layer of the second wafer, wherein one of the first wafer and the second wafer includes a nitride layer. In one embodiment the second wafer includes the nitride layer formed between the handle substrate and the second oxide layer. In another embodiment the second wafer includes a third oxide layer formed on the handle substrate and the nitride layer is formed between the second oxide layer and the third oxide layer of the second wafer. in a further embodiment the nitride layer is formed between the active semiconductor layer and the first oxide layer of the first wafer. In another embodiment the first wafer includes a third oxide layer formed on the active semiconductor layer and the nitride layer is formed between the third oxide layer and the first oxide layer on the first wafer.

In one embodiment a through silicon via (TSV) semiconductor device comprises a semiconductor device layer including a copper contact pad; a buried oxide (BOX) layer, the BOX layer comprising a first wafer having an active semiconductor layer and a first oxide layer; and a second wafer having a handle substrate and a second oxide layer, the second oxide layer being bonded to the first oxide layer, wherein one of the first wafer and the second wafer includes a nitride layer; and a handler substrate layer. In one embodiment the semiconductor device layer is formed on top of the BOX layer. In another embodiment the semiconductor device layer is formed through the BOX layer. In another embodiment the semiconductor device layer is one of an annular layer and a linear copper filled layer. In a further embodiment the semiconductor device layer includes an insulator layer.

In one embodiment a method of forming an SOI semiconductor device comprises forming an active layer on a semiconductor substrate; forming a first oxide layer on the active layer forming a second oxide layer on a handle substrate; forming a nitride layer on one of the semiconductor substrate and the handle substrate; and bonding the first oxide layer of the semiconductor substrate to the second oxide layer of the handle substrate. In one embodiment the nitride layer is formed between the handle substrate and the second oxide layer. In another embodiment a third oxide layer is formed on the handle substrate and the nitride layer is formed between the second oxide layer and the third oxide layer on the handle substrate. In a further embodiment the nitride layer is formed between the active layer and the first oxide layer of the semiconductor substrate. In another embodiment a third oxide layer is formed on the active layer and the nitride layer is formed between the third oxide layer and the first oxide layer on the first semiconductor substrate.

In one embodiment a method of forming a through silicon via (TSV) semiconductor device comprises forming a semiconductor device layer including a copper contact pad; and forming a buried oxide (BOX) layer on a handler substrate layer, the BOX layer comprising a first wafer having an active semiconductor layer and a first oxide layer; and a second wafer having a handle substrate and a second oxide layer, the second oxide layer being bonded to the first oxide layer, wherein one of the first wafer and the second wafer includes a nitride layer. In one embodiment the semiconductor device layer is formed on top of the BOX layer. In another embodiment the semiconductor device layer is formed through the BOX layer. In a further embodiment the semiconductor device layer is one of an annular layer and a linear copper filled layer. In another embodiment the semiconductor device layer includes an insulator layer.

BRIEF DESCRIPTION OF THE DRAWINGS

These and other objects, features and advantages of the present invention will become apparent from the following detailed description of illustrative embodiments thereto which is to be read in connection with the accompanying drawings, in which.

DETAILED DESCRIPTION

This disclosure is directed to the formulation of SOI substrates with a high quality silicon layer of a thickness of some tens of a nanometer to some hundreds of nanometers, depending on the type of semiconductor device to be formed, on a silicon dioxide layer of a thickness in the range of tenths of a nanometer to several hundred nanometers. In addition, a wafer bonding technique is employed in which a first wafer is provided, often referred to as a donor wafer and a second wafer is provided, often referred to as a handle wafer. A silicon dioxide layer with a required thickness, is grown or deposited on at least one of the wafers. At least one of the first wafer and the second wafer includes a nitride layer. Subsequently, an ion implantation is performed, preferably using hydrogen ions, with the first wafer, wherein ions are implanted through the silicon dioxide layer at a well-defined depth of the first wafer in such a manner that, between the silicon dioxide layer and the peak concentration of the hydrogen, a semiconductor layer with a specified thickness is maintained. The well known Smart-Cut® process may be used. After the implantation, the first wafer and the second wafer are bonded together, wherein the silicon dioxide of the first wafer forms a bonding interface with the silicon dioxide of the second wafer; or the silicon dioxide of the first wafer forms a bonding interface with the silicon of the second wafer. After the bond process, which involves an anneal step, the compound of the first wafer and the second wafer is subjected to a cleaving process, wherein the region including the implanted hydrogen ions acts as a separation layer so that finally an SOI wafer is obtained having a high-quality silicon layer formed on a silicon dioxide layer. The silicon layer may then be treated by chemical mechanical polishing (CMP) and/or rapid thermal annealing so as to obtain the required surface quality, as known in the art.

Figure 1A:
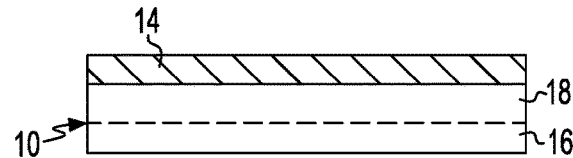
FIG. 1a shows processing of a donor wafer in accordance with one embodiment.
Figure 1B:
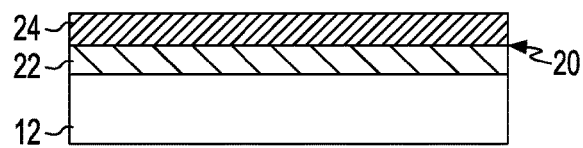
FIG. 1b shows processing of a handle wafer in accordance with one embodiment.
Figure 1C:
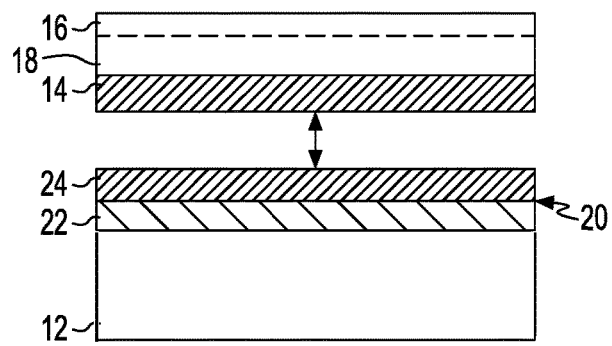
FIG. 1c shows a step of bonding the donor and handle wafers in accordance with one embodiment.

With reference to FIG. 1a-1e, illustrative embodiments of the present invention will now be described that may, in principle, employ the sequence as described above. In FIG. 1a and FIG. 1b, a first substrate 10, for example, a silicon wafer or any other appropriate semiconductor substrate, and a second substrate 12 such as a silicon wafer, a glass wafer or any other appropriate handle wafer, are provided. For instance, the first and second substrates 10 and 12 may be standard silicon wafers for standard integrated circuit fabrication as available from a plurality of vendors. Substrate 12 is subject to standard backside treatment for example, steps of spin rinse-dry (SRD), BW Backtouch, potassium hydroxide (KOH) clean, Scribe, Post Backtouch clean (where HF strips oxide from handle wafer, sulfuric, standard clean 1, standard clean 2), and bond clean. The semiconductor substrate 10, for example, can include at least one of silicon, SiGe, SiC, GaN, InP, GaAs, AlGaN, InAlN, AlGaN, or combinations thereof. It will be appreciated that the handle or semiconductor wafers can be either N or P type, with low or high doping concentration, depending on the application.

The first substrate 10 has formed thereon an insulating layer 14 of required thickness. In one particular embodiment, the insulating layer 14 is a silicon dioxide layer with a thickness in the range of approximately 50 nm to 0.05 μm. The insulating layer 14 may be formed by any suitable growth and/or deposition method known in the art. For example, the insulating layer 14, when provided as a silicon dioxide layer, may be formed by oxidizing the first substrate 10 to form a thermal oxide layer.

The first substrate 10 is subjected to ion implantation, so as to form an implantation region 16, the peak concentration of which is located at a predefined depth that is well controllable by the implantation parameters and the thickness of the insulating layer 14.

Preferably, hydrogen ions are implanted with a dose and energy suitable to provide the implantation region 16 approximately 10-500 nm below the insulating layer 16. An active region 18 is formed between the silicon dioxide layer 14 and the ion implantation donor region 16.

The second substrate 12 has formed thereon a diffusion barrier layer 20, the composition and the thickness of which is selected so as to act as a diffusion barrier for copper atoms and ions at elevated temperatures which may occur during the fabrication of semiconductor devices. In the embodiment in FIG. 1b, the diffusion barrier layer 20 is a nitride layer 22, which is a well-known dielectric material that effectively prevents copper atoms and ions form mitigating therethrough and a silicon dioxide layer 24. The thickness of the diffusion barrier layer 20 may range from 10 nm to several hundred nanometers, depending on process requirements. For instance, if the second substrate 12 is a silicon wafer that will be used as a handle wafer for the further processing and formation of a semiconductor device, it may be advantageous that the diffusion layer 20 have a thickness of 50 nanometers to reduce or eliminate the chances of copper contamination during the processing of the substrate 12. In the case where the substrate 12 is a material in which copper has a significantly smaller diffusion coefficient (as compared to silicon), the thickness of the diffusion layer 20 may be selected in the range of 10-200 nm. The formation of the diffusion barrier layer 20 may involve any appropriate deposition method, such as plasma enhanced or low pressure chemical and physical vapor deposition to form, for example, a silicon nitride layer 22 and a silicon dioxide layer 24.

Figure 1D:
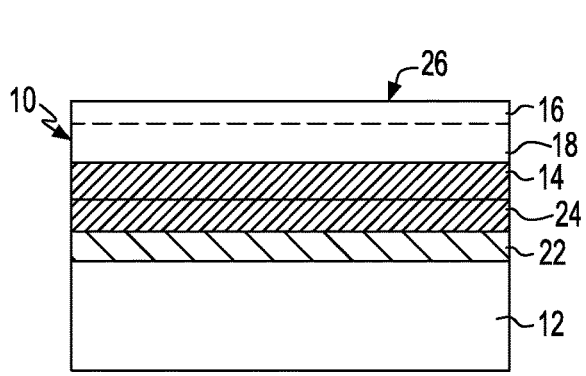
FIG. 1d shows bonded donor and handle wafers in accordance with one embodiment.
Figure 1E:
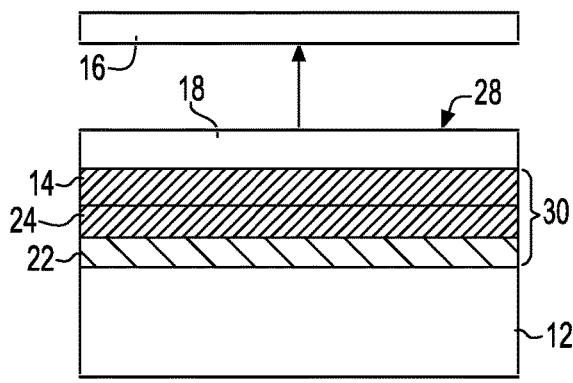
FIG. 1e shows the processing of removing a donor layer in accordance with one embodiment.

FIG. 1e schematically shows the first substrate 10 and the second substrate 12 immediately prior to the bonding process, wherein the oxide layer 24 of the diffusion barrier layer 20 and the insulating layer 14 are arranged to face each other.

In FIG. 1d, a compound structure 26 is formed, including the substrate 12, the nitride layer 22, the oxide layer 24, the oxide layer 14, and the active layer 18 and the donor layer 16 of substrate 10. As previously noted, bonding the substrate 10 and the substrate 12 may require an anneal step to insure the required stability of the compound substrate 130, all of which may be accomplished using known prior art techniques.

FIG. 1e schematically shows the substrate 12 after separation of the implantation region 16 of substrate 10. The separation of the two substrates may be accomplished by a water jet at the perimeter of the compound substrate 26 at a position corresponding to the implantation region 16. The resulting BOX structure 28, having the active layer 18 formed on the top thereof, may then be subjected to any surface treatment, such as CMP, to obtain the required surface properties for the further processing of the substrate.

As described above, the present disclosure is directed method and structure to form SOI BOX wafer with nitride or other mobile ion and/or copper diffusion barrier embedded in the SOI insulator. As a result, contrary to the conventional SOI substrate, according to the present invention, the BOX structure 26 includes the diffusion barrier layer 30 that effectively prevents copper atoms and mobile ions from diffusing through the diffusion barrier layer 30 into the active layer 18. In this embodiment, diffusion barrier layer 30 includes nitride layer 22, oxide layer 24 and oxide layer 14. The stability of the BOX structure 28 is improved over prior art structures because of the oxide: oxide bond between layers 14 and 24.

FIGS. 1a-1e discloses one embodiment the BOX structure of the invention in which a handle wafer with a nitride layer and an oxide layer is bonded to a semiconductor wafer with an oxide layer and a smart cut donor layer.

Figure 2A:
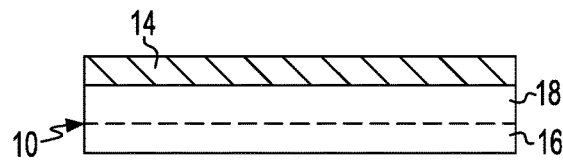
FIG. 2a shows a processing step in accordance with another embodiment.
Figure 2B:
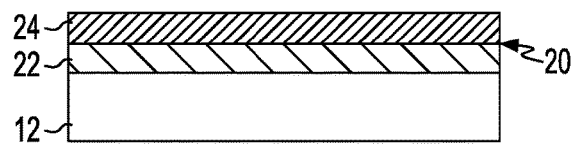
FIG. 2b shows processing of a handle wafer in accordance with one embodiment.
Figure 2C:
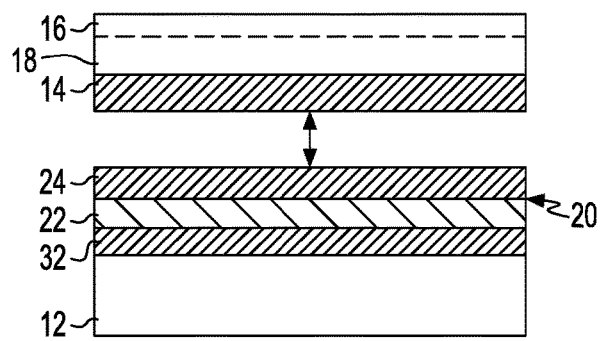
FIG. 2c shows a step of bonding the donor and handle wafers in accordance with one embodiment.
Figure 2D:
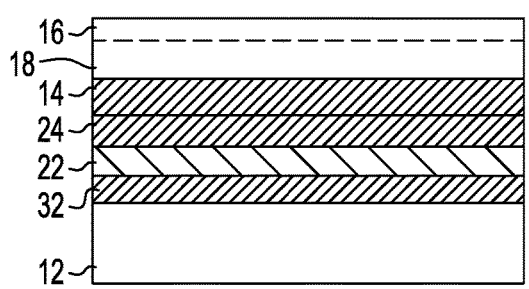
FIG. 2d shows bonded donor and handle wafers in accordance with one embodiment.
Figure 2E:
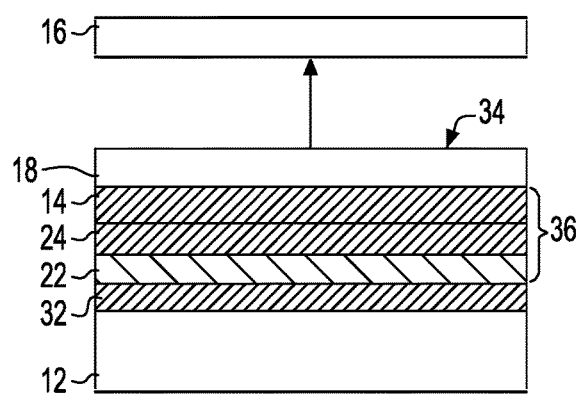
FIG. 2e shows the processing of removing a donor layer in accordance with one embodiment.

FIGS. 2a-2e discloses the process for forming a BOX structure of a handle wafer with an oxide layer, a nitride layer and an oxide layer bonded to a semiconductor wafer with an oxide layer and a smart cut donor layer. In this embodiment the substrate 12 includes an oxide layer 32 formed on the semiconductor substrate 12 and the nitride layer 22 is formed between the oxide layer 24 and the oxide layer 32 of the substrate 12. In FIG. 2e, the resulting SOI wafer 34 BOX structure 36 includes a barrier diffusion layer 22 that includes oxide layers 14,24 and 32.

Figure 3A:
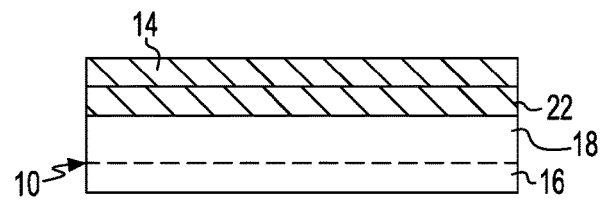
FIG. 3a shows a processing step in accordance with a further embodiment.
Figure 3B:
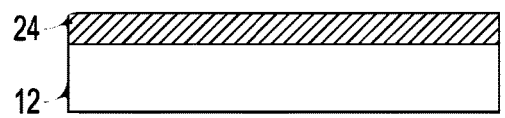
FIG. 3b shows processing of a handle wafer in accordance with one embodiment.
Figure 3C:
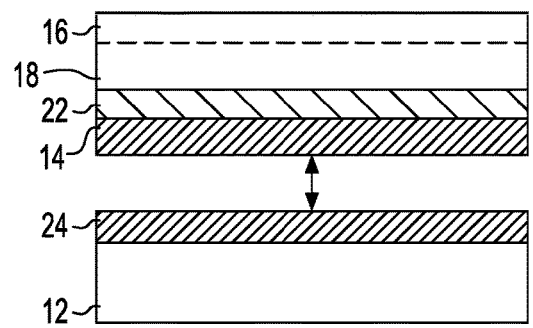
FIG. 3c shows a step of bonding the donor and handle wafers in accordance with one embodiment.
Figure 3D:
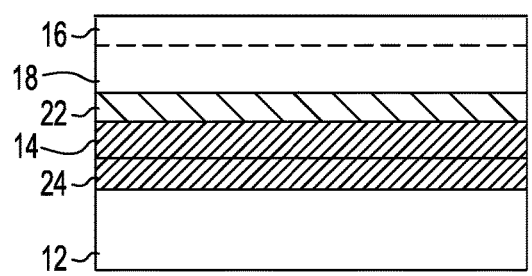
FIG. 3d shows bonded donor and handle wafers in accordance with one embodiment.
Figure 3E:
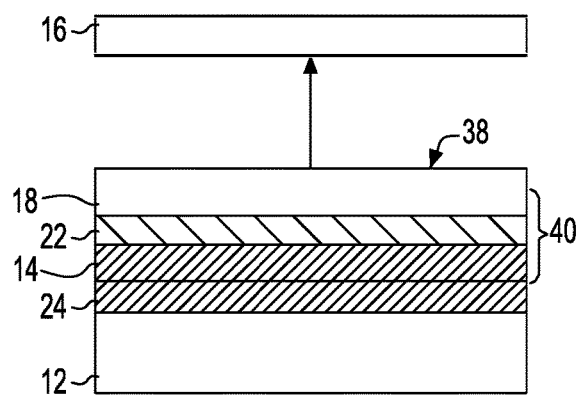
FIG. 3e shows the processing of removing a donor layer in accordance with one embodiment.
Figure 4A:
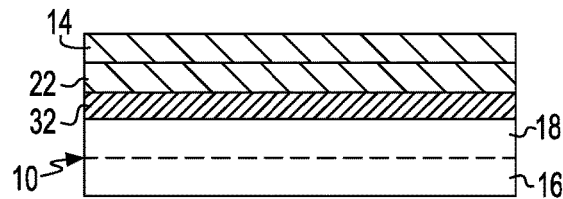
FIG. 4a shows a processing step in accordance with another embodiment.
Figure 4B:
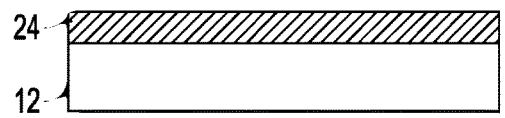
FIG. 4b shows processing of a handle wafer in accordance with one embodiment.
Figure 4C:
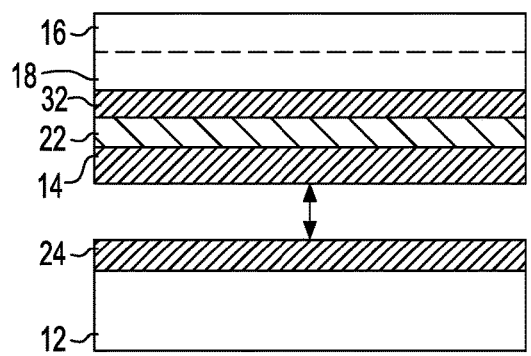
FIG. 4c shows a step of bonding the donor and handle wafers in accordance with one embodiment.
Figure 4D:
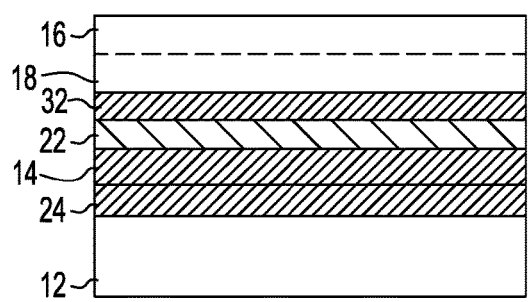
FIG. 4d shows bonded donor and handle wafers in accordance with one embodiment.
Figure 4E:
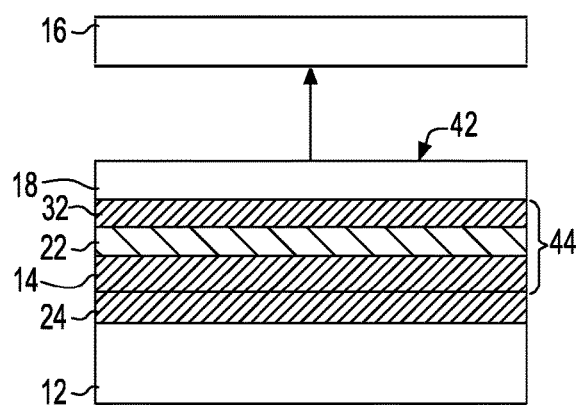
FIG. 4e shows the processing of removing a donor layer in accordance with one embodiment.

FIGS. 3a-3e discloses the process for forming a BOX structure of a handle wafer with an oxide layer bonded to a semiconductor wafer with an oxide later, a nitride layer and a smart cut donor layer. In this embodiment the nitride layer 22 is formed between the active semiconductor layer 18 and the oxide layer 14 of the semiconductor wafer 10. In FIG. 3e, the resulting SOI wafer 38 includes a BOX structure 40 that includes oxide layers 14,24 and nitride layer 22. [0042] FIGS. 4a-4e discloses a process for forming a BOX structure of a handle wafer with an oxide layer bonded to a semiconductor wafer with an oxide layer, a nitride layer, an oxide layer and a smart cut donor layer. In this embodiment, the semiconductor wafer 10 includes oxide layer 32 formed on the active semiconductor layer 18 and the nitride layer 22 is formed between the oxide layer 32 and the oxide layer 14. In FIG. 4e, the resulting SOI wafer 42 has a BOX structure 44 includes a barrier diffusion layer 22 that includes oxide layers 14,24 and 32.

Figure 5:
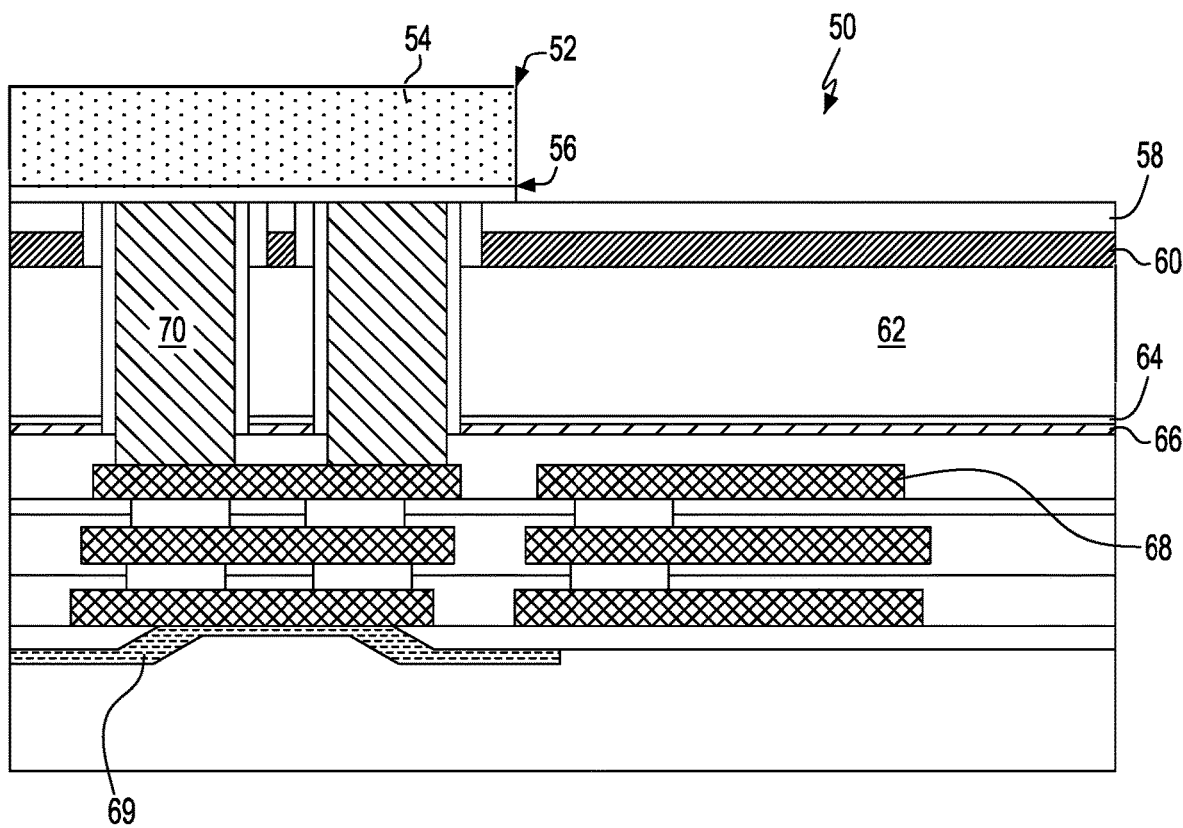
FIG. 5 shows a TSV structure according to one embodiment.

FIG. 5 shows a through silicon via (TSV) semiconductor device 50 having a semiconductor device layer 52 including a copper contact pad 54 and a TiW layer 56. The device 50 includes nitride layer 58, oxide layer 60 and layer 62. A BOX layer 64 comprises a first wafer having an active semiconductor layer and a first oxide layer and a second wafor having a semiconductor substrate and a second oxide layer, the second oxide layer being bonded to the first oxide layer, in which one of the first wafor and the second wafer includes a nitride layer; and a handler substrate layer, as shown in one of FIGS. 1e-4e. Layer 66 contains semiconductor devices such as FETS. Layer 68 is a back end wiring level that was previously constructed on the semiconductor substrate. Layer 69 is the final metal termination, also referred to as under bump metallurgy. Layer 70 is the through silicon via that connects the back end wiring on the front side of the semiconductor substrate to the backside of the semiconductor substrate.

The TSV device 50 is formed from wafer topside (over BOX), through BOX, to thinned handle wafer backside. The TSV device can be an annular TSV, a liner/copper filled TSV or an insulated TSV. The SiN layer in BOX may need to be densified at the bonding temperature or higher to avoid outgassing or shrinking during bonding.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

What is claimed is:

1. A semiconductor-on-insulator (SOI) semiconductor device, comprising:
   an active semiconductor layer;
   a buried insulator layer bonded on a first side thereof to the active semiconductor layer;
   a substrate bonded to the buried insulator layer on a second side of the buried insulator layer,
   wherein the buried insulator layer includes:
      a pair of oxide layers including a first oxide layer bonded to an immediately adjacent second oxide layer, and
      a nitride layer positioned between the pair of oxide layers and a selected one of the active semiconductor layer or the substrate.

2. The SOI semiconductor device of claim 1, further comprising a third oxide layer positioned between the selected one of the active semiconductor layer or the substrate and the nitride layer.

3. The SOI semiconductor device of claim 1, wherein the pair of oxide layers has a first surface adjacent the nitride layer and a second, opposing surface adjacent the active semiconductor layer.

4. The SOI semiconductor device of claim 3, wherein the second, opposing surface is immediately adjacent to the active semiconductor layer.

5. The SOI semiconductor device of claim 1, wherein the pair of oxide layers has a first surface adjacent the nitride layer and a second, opposing surface adjacent the substrate.

6. The SOI semiconductor device of claim 5, wherein the second, opposing surface is immediately adjacent to the substrate.

7. The SOI semiconductor device of claim 1, wherein one of the first oxide layer or the second oxide layer is directly adjacent to the substrate.

8. The SOI semiconductor device of claim 1, wherein one of the first oxide layer or the second oxide layer is directly adjacent to the active semiconductor layer.

9. The SOI semiconductor device of claim 1, wherein the nitride layer is positioned between the first oxide layer and the substrate, and the second oxide layer is positioned between the active semiconductor layer and the first oxide layer.

10. The SOI semiconductor device of claim 9, further comprising a third oxide layer positioned between the nitride layer and the substrate.

11. The SOI semiconductor device of claim 10, wherein the nitride layer is positioned between the first oxide layer and the third oxide layer, and the second oxide layer is positioned between the active semiconductor layer and the first oxide layer.

12. The SOI semiconductor device of claim 1, wherein the nitride layer is positioned between the first oxide layer and the active semiconductor layer, and the second oxide layer is positioned between the substrate and the first oxide layer.

13. The SOI semiconductor device of claim 12, further comprising a third oxide layer positioned between the nitride layer and the active semiconductor layer.

14. The SOI semiconductor device of claim 13, wherein the nitride layer is positioned between the first oxide layer and the third oxide layer, and the second oxide layer is positioned between the substrate and the first oxide layer.

* * * * *